United States Patent
Tu et al.

(10) Patent No.: US 7,457,178 B2
(45) Date of Patent: Nov. 25, 2008

(54) TRIMMING OF ANALOG VOLTAGES IN FLASH MEMORY DEVICES

(75) Inventors: Loc Tu, San Jose, CA (US); Jeffrey Lutze, San Jose, CA (US); Jun Wan, Sunnyvale, CA (US); Jian Chen, Sunnyvale, CA (US)

(73) Assignee: SanDisk Corporation, Milpitas, CA (US)

( * ) Notice: Subject to any disclaimer, the term of this patent is extended or adjusted under 35 U.S.C. 154(b) by 206 days.

(21) Appl. No.: 11/331,479

(22) Filed: Jan. 12, 2006

(65) Prior Publication Data

US 2007/0159891 A1 Jul. 12, 2007

(51) Int. Cl.
*G11C 29/00* (2006.01)
(52) U.S. Cl. .............. 365/201; 365/185.18; 365/185.24
(58) Field of Classification Search ................. 365/201, 365/185.18, 210, 185.17, 185.24, 185.33, 365/185.03, 185.21
See application file for complete search history.

(56) References Cited

U.S. PATENT DOCUMENTS

| | | | |
|---|---|---|---|
| 5,172,338 A | 12/1992 | Mehrotra et al. | |
| 5,675,546 A | 10/1997 | Leung | |
| 5,801,989 A * | 9/1998 | Lee et al. | 365/185.22 |
| 5,936,906 A | 8/1999 | Tsen | |
| 6,091,631 A | 7/2000 | Kucera et al. | |
| 6,184,726 B1 | 2/2001 | Haeberli et al. | |
| 6,201,734 B1 | 3/2001 | Sansbury et al. | |
| 6,301,151 B1 | 10/2001 | Engh et al. | |
| 6,370,061 B1 | 4/2002 | Yachareni et al. | |
| 6,380,506 B1 * | 4/2002 | Pan | 219/121.12 |
| 6,490,201 B2 | 12/2002 | Sakamoto | |
| 6,747,892 B2 | 6/2004 | Khalid | |
| 7,020,037 B2 | 3/2006 | Anzai et al. | |
| 7,102,555 B2 * | 9/2006 | Collins et al. | 341/120 |
| 7,251,705 B2 * | 7/2007 | Pasotti et al. | 711/103 |
| 2002/0085436 A1 | 7/2002 | Chang | |
| 2003/0002334 A1 | 1/2003 | Chang | |
| 2005/0213378 A1 | 9/2005 | Chang | |

OTHER PUBLICATIONS

Jung et al., "A 117-mm2 3.3-V Only 128 Mb Multilevel NAND Flash Memory for Mass Storage Applications", J. Solid State Circ., vol. 31, No. 11 (1996), pp. 1575-1583.
Takeuchi et al., "A Multipage Cell Architecture for High-Speed Programming Multilevel NAND Flash Memories", J. Solid State Circ., vol. 33, No. 8 (1998), pp. 1228-1238.

(Continued)

*Primary Examiner*—Dang T Nguyen
(74) *Attorney, Agent, or Firm*—Vierra Magen Marcus & DeNiro LLP

(57) ABSTRACT

A flash memory device of the multi-level cell (MLC) type, in which control gate voltages in read and programming operations and a bandgap reference voltage source are trimmable from external terminals, is disclosed. In a special test mode, control gate voltages can be applied to a selected programmed memory cell so that the threshold voltage of the cell can be sensed. A digital-to-analog converter (DAC) use for programming and a second read/verify DAC apply varying analog voltages and are sequentially used to verify the programming of an associated set of memory cells in this special test mode, with the DAC input values that provide the closest result selected for use in normal operation. These DAC's are dependent on the value of a reference source that my also be trimmed.

11 Claims, 6 Drawing Sheets

OTHER PUBLICATIONS

Cho et al. "A Dual-Mode NAND Flash Memory: 1-Gb Multilevel and High-Performance 512-Mb Single-Level Modes", J. Solid State Circ., vol. 36, No. 11 (2001), pp. 1700-1706.

Elmhurst et al., "A 1.8-V 128-Mb 125-MHz Multilevel Cell Flash Memory With Flexible Read While Write", J. Solid State Circ., vol. 38, No. 11 (2003), pp. 1929-1933.

* cited by examiner

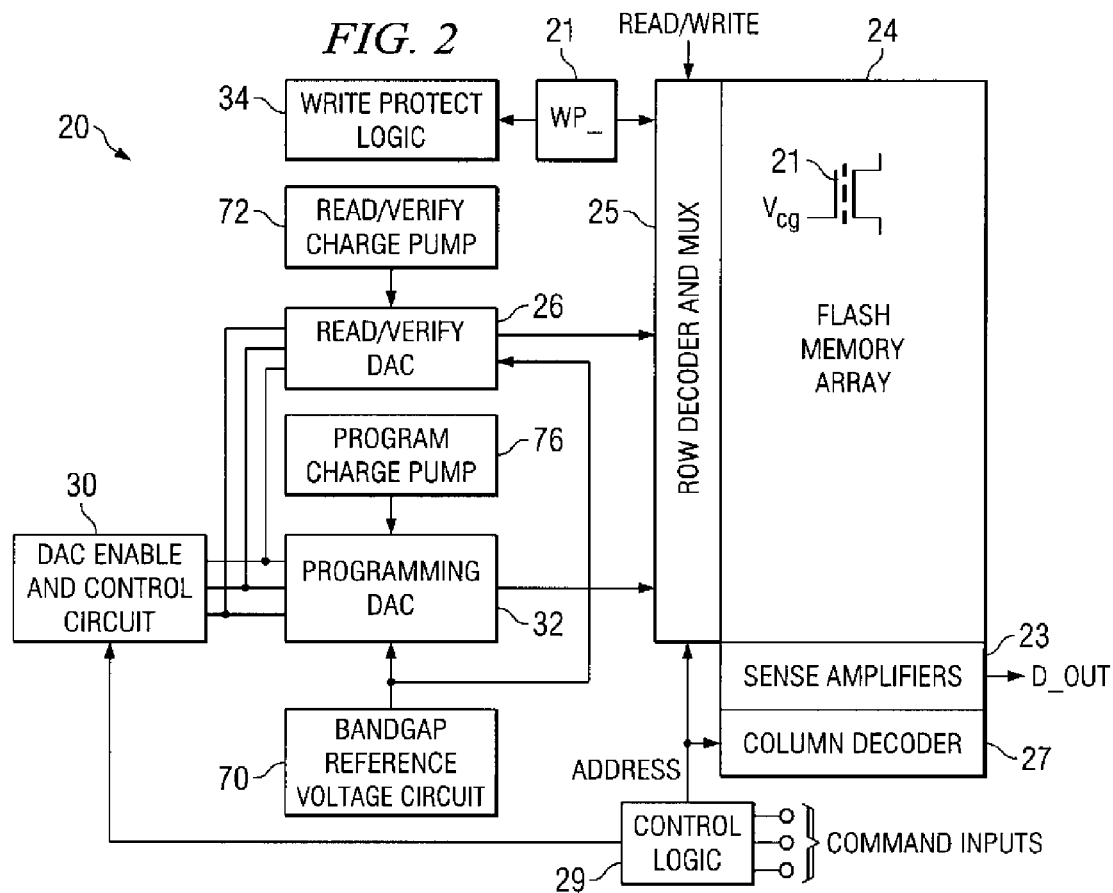
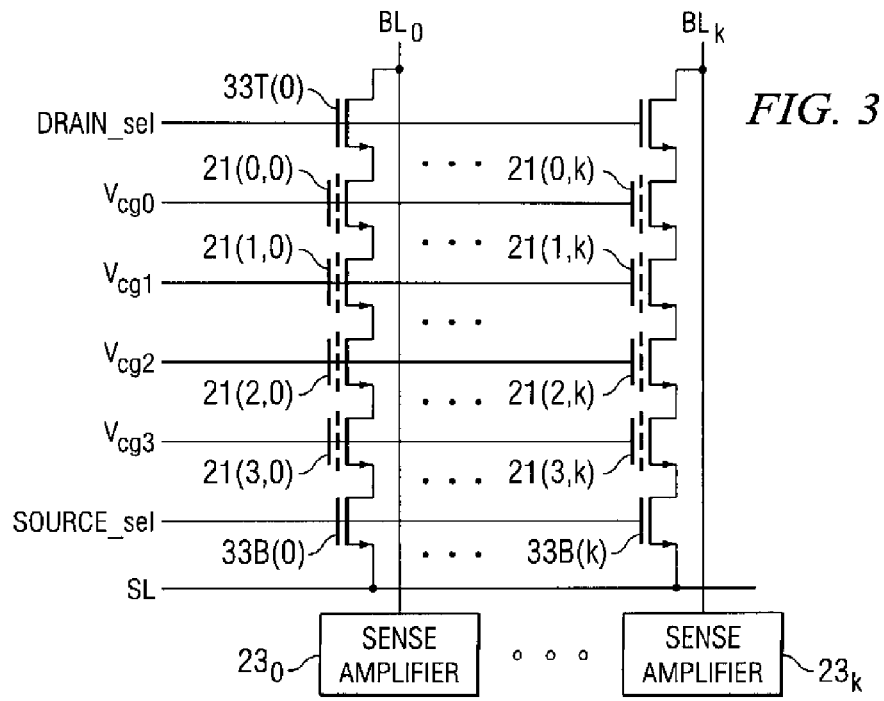

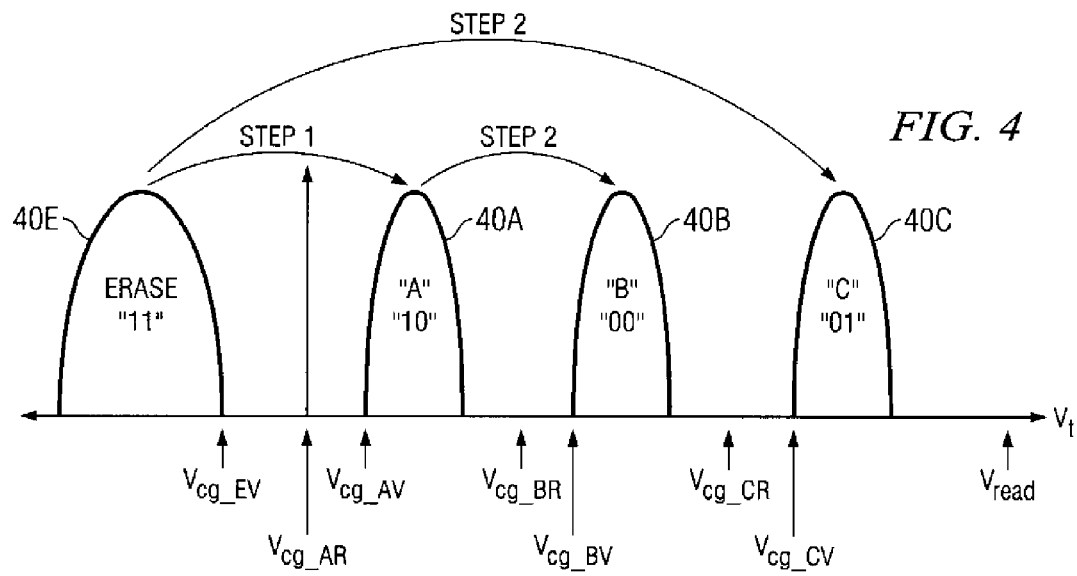
FIG. 4
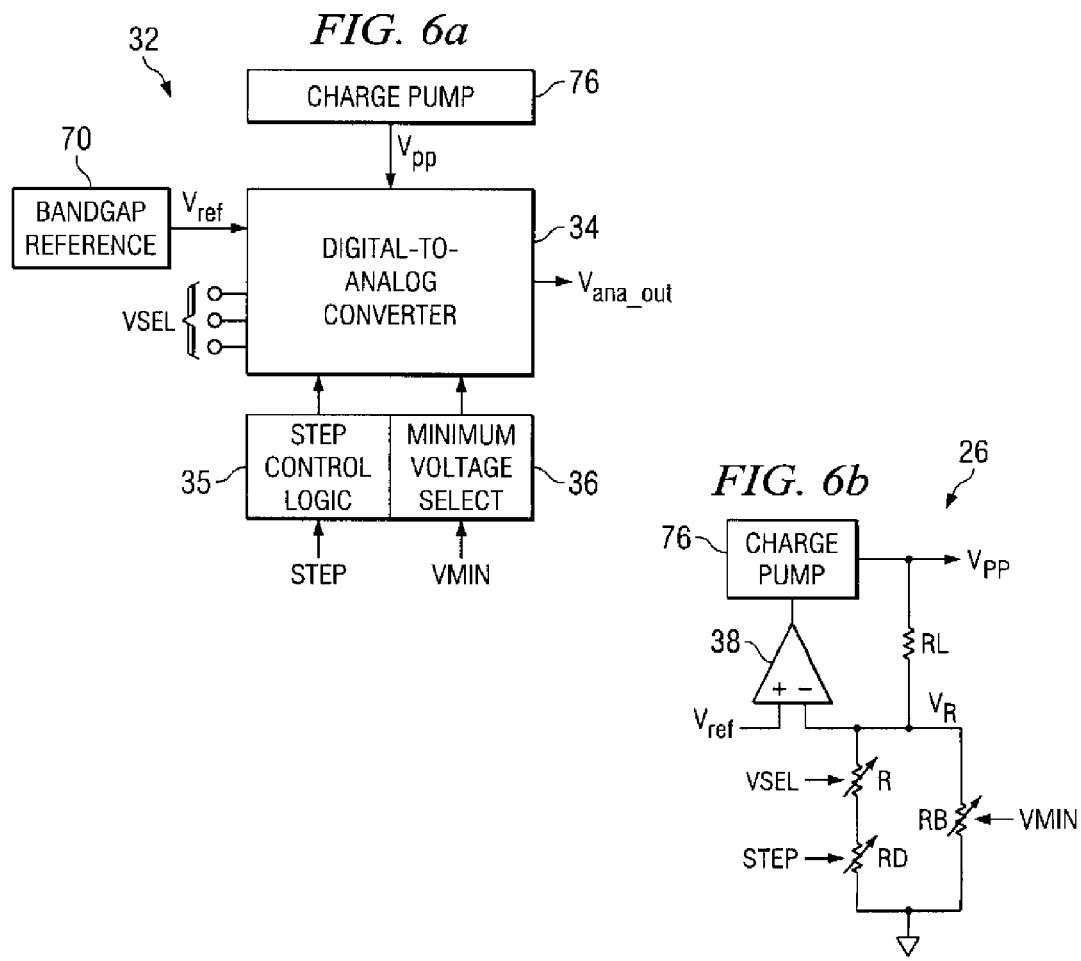
FIG. 6a
FIG. 6b

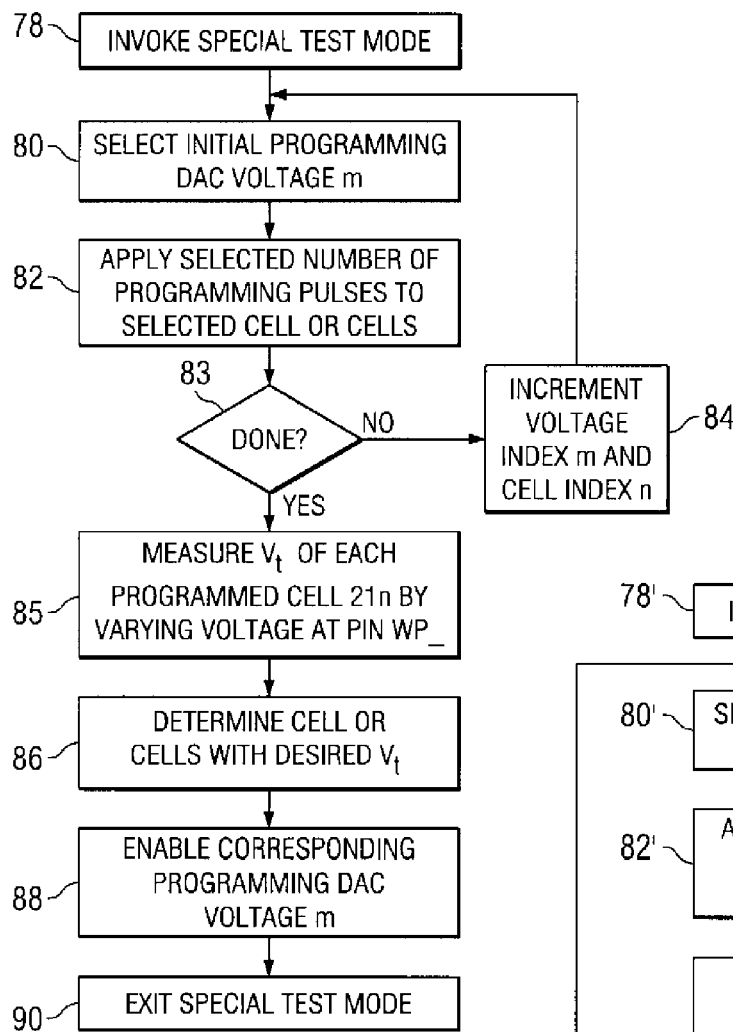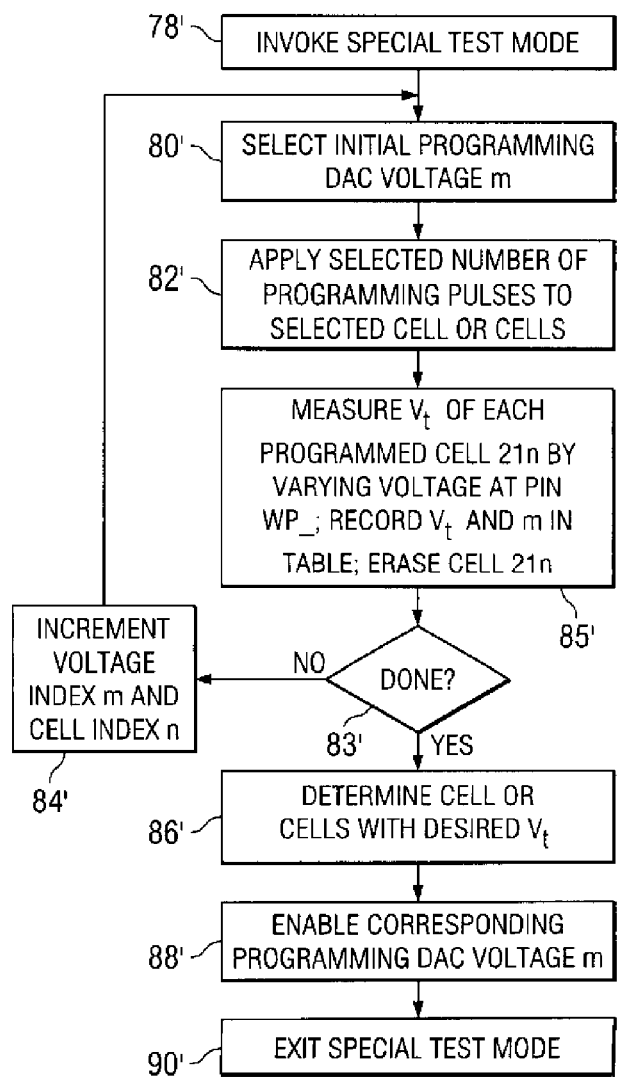

TRIMMING OF ANALOG VOLTAGES IN FLASH MEMORY DEVICES

CROSS-REFERENCE TO RELATED APPLICATION

This application is related to U.S. patent application Ser. No. 11/332,567, entitled "Flash Memory Devices with Trimmed Analog Voltages" filed on the same day as the present application, and hereby incorporated by reference in its entirety.

STATEMENT REGARDING FEDERALLY SPONSORED RESEARCH OR DEVELOPMENT

Not applicable.

BACKGROUND OF THE INVENTION

This invention is in the field of semiconductor non-volatile memories, and is more specifically directed to the manufacture of flash memories.

As well known in the art, "flash" memories are electrically-erasable semiconductor memory devices that can be erased and rewritten in relatively small blocks, rather than on a chip-wide or large-block basis as in previous electrically-erasable programmable read-only memory (EEPROM) devices. As such, flash memory has become especially popular for applications in which non-volatility (i.e., data retention after removal of power) of the stored data is essential, but in which the frequency of rewriting is relatively low. Examples of popular applications of flash memory include portable audio players, "SIM" card storage of telephone numbers and phone activity in cellular telephone handsets, USB flash drive removable storage devices for computers and workstations, storage cards for digital cameras, and the like.

An important recent advance in semiconductor non-volatile memory technology is the arrangement of the flash memory cells as "NAND" memory rather than "NOR" memory. As known in the art, NOR flash memory refers to the conventional arrangement of a column of memory cells in parallel between a bit line and a source line. Access of a specific cell in a NOR column is made by driving its word line (control gate) active while holding the other cells in the column off, so that the current between the bit line and source line is determined by the state of the accessed cell. Memory cells in a column of NAND memory, on the other hand, are connected in series between the bit line and the source line. Accessing of a specific cell in a NAND column thus requires turning on all of the cells in the column with active word line levels, and applying an intermediate word line level to the cell to be accessed, such that the current between the bit line and source line is, again, determined by the state of the accessed cell. As well known in the art, the chip area required per bit of NAND flash memory is much reduced from the area per bit of NOR flash memory, primarily because fewer conductors (and therefore contacts) are required for a column of NAND memory relative to NOR memory; in addition, access transistors can be shared among a large number of cells in the NAND arrangement. Additionally, conventional NAND flash memory is conveniently accessed serially, for example by sequentially accessing cells along the columns, rather than as a random access memory as in the case of NOR memory. NAND memory is thus especially well-suited for music and video storage applications Another important recent advance in the field of flash memory is referred to in the art as the multilevel program cell (MLC). According to this approach, more than two data states are made possible for each memory cell, simply by more finely controlling the programming of the cell. In conventional binary data storage, each memory cell is programmed into either a "0" or a "1" state. Reading of such binary cells is accomplished by applying a single control voltage to the control gate of the addressed memory cell so that the transistor conducts if programmed to a "1" state, but remains off in the "0" state; sensing of the conduction through the addressed memory cell thus returns the programmed state of the cell. In contrast, according to a typical example of the MLC approach, four possible states are defined for each memory cell, typically corresponding to binary values 00, 01, 10, 11. In effect, the two intermediate states correspond to two levels of partial programming of the cell between the fully erased and fully programmed states. Some implementations of MLC flash memory with up to eight possible states, or three binary bits, per cell are known. The ability to store two or three bits of data on each memory cell immediately doubles or triples the data capacity of a flash memory chip. Examples of MLC flash memory cells and memories including such MLC cells are described in U.S. Pat. No. 5,172,338, and U.S. Pat. No. 6,747,892 B2, both commonly assigned herewith and incorporated herein by this reference.

The combination of MLC technology with the efficiencies of NAND flash memory architectures has resulted in significantly reduced cost per bit for semiconductor non-volatile storage. As a result, a wide range of new applications for flash memory have become feasible, up to and including mass data storage for personal computers, replacing magnetic disk drives.

MLC flash memories are thus achieved by changes in the programming and sensing operations, more so than by changes in the memory cell structure. As known in the art, the multi-level programming of conventional floating gate transistors is achieved primarily by varying the duration and number of programming pulses applied to the control gate of the floating-gate EEPROM transistor; the sequencing of programming voltages is another known approach to programming the various memory states. On the sensing side, the programmed data state of an MLC cell can be sensed by applying a single word line or control gate voltage to the cell, and comparing the resulting data state against multiple reference cells or reference levels to determine the data state of the cell. Such an approach is described in the above-referenced U.S. Pat. No. 5,172,338. Modern MLC memories sense the programmed data state of a cell by applying a sequence of control gate voltages to the accessed cell, with the sequence of results indicating the programmed state of the cell, as described in the above-referenced U.S. Pat. No. 6,747,892 B2.

A limiting factor in realizing MLC cells, and in increasing the data density of such cells, is the precision with which distinct data states may be programmed and sensed. To accomplish this, conventional MLC flash memories generate several analog voltages on-chip, including those analog voltages that are applied to the control gate to sense and program the desired memory cell state. In order to attain the necessary precision of these analog voltages, the manufacture and test of modern MLC flash memories can include "trimming", or adjustment, of voltages internal to the flash memory device, for example during or after electrical test of the flash memory devices when still in wafer form. The flash memory devices themselves provide circuitry and interface capability (i.e., test pads at the die surface) to enable such trimming, as will now be described relative to FIG. 1a.

FIG. 1a illustrates an architecture of a conventional flash memory device 2, in which the ability to trim analog voltages is provided. In device 2, flash memory array 4 includes a plurality of flash memory cells 3, each implemented by way of a floating-gate MOS transistor, arranged in rows and columns in the conventional manner. In this example, flash memory cells 3 correspond to the well-known NAND arrangement, although a NOR architecture may also be utilized. And, as is also conventional in the art especially for NAND flash memory, flash memory cells 3 are preferably of the multi-level cell (MLC) type, programmable into more than two states as discussed above. In this conventional memory device 2, control gate digital-to-analog converter (DAC) 6 receives multiple digital inputs, and generates control gate voltage $V_{cg}$ accordingly; in the MLC arrangement, the digital inputs may be a representation of a control gate voltage $V_{cg}$ to be applied to read or sense one of the MLC programmed states. Control gate voltage $V_{cg}$ is generated by control gate DAC 6 accordingly, and is applied to row decoder 5 for application to the word line, or control gate, of a row of flash memory cells 3 to be read. Other fixed voltages (i.e., $V_{dd}$ or ground) are applied to the gates, bit line, and source line, of the NAND arrangement of flash memory cells 3 in each selected column, as known in the art; one or more columns are then selected by column decoder 7 for sensing and output via sense amplifiers 13, in the conventional manner. Also in this conventional memory device 2, bandgap reference circuit 8 is also provided, for generating a reference voltage $V_{ref}$ from which such voltages as the programming pulses applied to the control gates of flash memory cells 3 are generated. Control logic 9 controls the operation of memory device 2, for example in response to one or more commands from a memory controller (not shown), in the example of NAND arrangement of flash memory cells 3.

Memory device 2 is trimmable, typically in wafer or die form, through the use of dedicated device "pads" of memory device 2. These pads are typically realized as aluminum or other metal pads at the chip surface of the integrated circuit embodying memory device 2, contactable by a conventional test probe. Alternatively, if desired, these pads may be bonded out to terminals or pins of the package of memory device 2, and thus accessible after packaging. In this conventional arrangement, particular analog voltages within memory device 2 can be directly monitored by way of such a pad. For example, control gate voltage $V_{cg}$ as generated by control gate DAC 6 appears at probe pad $V_{cg}$ TEST OUT PAD, and reference voltage $V_{ref}$ from bandgap reference circuit 8 appears at probe pad $V_{ref}$ TEST OUT PAD. As such, each of these analog voltages can be directly measured during operation by conventional test equipment. The trimming of these analog voltages may be effected by way of one or more instances of programmable impedance elements 11 in control gate DAC 6 and bandgap reference circuit 8. For example, programmable impedance elements 11 may be arranged in a voltage divider as shown, and programmable by the application of a programming voltage to corresponding device pads DAC PGM PAD for the programming of control gate DAC 6, and to pad BG PGM PAD for the programming of bandgap reference circuit 8. Examples of the construction and programming of programmable impedance elements 11 are described in U.S. Pat. No. 6,201,734 B1, issued Mar. 13, 2001, entitled "Programmable Impedance Device", commonly assigned herewith and incorporated herein by this reference. Alternately, programmable impedance elements 11 may be implemented as fixed resistors in parallel or series with a transistor switch that can be turned on or off in response to a signal from a dedicated volatile latch (not shown). The latch may be loaded, for example, during the power initiation cycle or at other times, with a unique value stored in a dedicated ROM, EPROM, or EEPROM (not shown), or alternately from a memory location in the main flash memory array 3. The state of the latch is often referred to as a "fuse" even though the data may be physically stored as a cell value within a larger memory unit.

In operation of the conventional trimming of the analog voltages in memory device 2, therefore, test equipment measures the analog voltages $V_{cg}$ and $V_{ref}$ at corresponding test pads $V_{cg}$ TEST OUT PAD and $V_{ref}$ TEST OUT PAD. In the case of the control gate voltage $V_{cg}$, this measurement may be made at one or more of the possible analog output levels as determined by the application of the corresponding digital values at the input of control gate DAC 6. If the measured analog voltages are at levels other than nominal for the corresponding function, the conventional test equipment programs, or erases and reprograms, programmable impedance elements 11 in DAC 6 or bandgap reference circuit 8 (or sets values of "fuses"), and the corresponding analog voltage is measured again. Upon programming of the programmable impedance elements 11 to attain the desired analog voltages, memory device 2 is then ready for dicing, packaging, and completion of the manufacturing process in the conventional manner. The trimming of the analog voltages thus permits optimization of the performance and margins of memory device 2, compensating for variations in the manufacturing process.

In this conventional arrangement of FIG. 1a, however, the probe pads for monitoring and trimming these of course occupy substantial chip area, not only for the pads themselves but also for the conductors that run to the pads. This additional chip area can be minimized by not providing conventional electrostatic discharge (ESD) protection devices for these pads (assuming that the pads are available only in die or wafer form, and not after packaging), but of course elimination of such protection devices renders memory device 2 vulnerable to ESD events at these test pads. In addition, in those instances in which the test pads are not available after packaging, any shift or change in device operation caused by the packaging of memory device 2 (e.g., package-induced stress effects on the silicon) cannot be compensated by further trimming, because the measuring and programming test pads are inaccessible after packaging.

BRIEF SUMMARY OF THE INVENTION

It is therefore an object of this invention to provide a flash memory and method of operating the same that enables the measuring and trimming of analog voltages in a flash memory device through normal device pins, and thus without requiring special or additional pads or pins for such measuring and trimming.

It is a further object of this invention to provide such a memory and method in which the read margins of multi-level program flash memory cells (MLC) can be optimized based on the measurement of flash memory cell threshold voltages.

It is a further object of this invention to provide such a memory and method in which programming reference voltages can be measured and adjusted to optimize the programmed levels of MLC flash memory cells.

It is a further object of this invention to provide such a memory and method that can be applied to a flash memory device after its packaging.

Other objects and advantages of this invention will be apparent to those of ordinary skill in the art having reference to the following specification together with its drawings.

The present invention may be implemented into a flash memory device, and method of operating and manufacturing the same. According to a first aspect of the invention, a functional pin or terminal of the flash memory device is enabled, in a special mode, to apply an externally applied voltage as a control gate voltage, in order to measure the threshold voltage of a floating-gate transistor in a selected memory cell. The read, or verify, circuitry of the memory device includes a digital-to-analog converter (DAC) that generates the control gate voltage in normal operation. Each of a plurality of sets of memory cells is associated with each of a plurality of verify voltages, and the cells in each set are programmed to a threshold voltage at or above its associated verify voltage, as issued by the DAC. The threshold voltages of the sets of programmed cells are then measured from the functional pin, to identify one of the sets of memory cells as programmed to a desired threshold voltage distribution, and its verify voltage is enabled, at the DAC, for use in normal operation. The process may be repeated for one or more additional programming levels (i.e., threshold voltages) for multi-level cell (MLC) memories, selecting another one of a plurality of DAC voltages for each such level.

According to another aspect of the invention, an offset DAC is provided to adjust a bandgap reference voltage, as applied to a charge pump circuit for generating the cell programming voltages. The offset voltage can vary according to a digital input applied to the offset DAC. The DAC, and a subsequent charge pump, generates a selected number of programming pulses applied to one of the flash memory cells, in the special mode. The resulting threshold voltages are measured from the functional terminal. The offset DAC voltage that provides the proper programming level for a desired number of programming pulses is then selected and enabled for use in normal operation of the flash memory. The process may be repeated for the programming of another program level, in MLC flash memory.

BRIEF DESCRIPTION OF THE SEVERAL VIEWS OF THE DRAWING

FIG. 2 is an electrical diagram, in block form, of a trimmable flash memory device according to the preferred embodiment of the invention.

FIG. 3 is an electrical diagram, in schematic form, illustrating a NAND arrangement of flash memory cells, as incorporated into the flash memory device of FIG. 2 according to the preferred embodiment of the invention.

FIG. 4 is a plot of threshold voltage distribution for multiple programming levels in a multi-level cell (MLC) flash memory, according to the preferred embodiment of the invention.

FIG. 6a is an electrical diagram, in block form, of the construction of a programming digital-to-analog converter (DAC) in the flash memory device of FIG. 2, according to the preferred embodiment of the invention.

FIG. 6b is an electrical diagram, in schematic form, illustrating an equivalent circuit arrangement of the DAC of FIG. 6a according to the preferred embodiment of the invention.

FIG. 7 is a flow diagram illustrating a method of trimming the programming voltage generation circuitry of FIG. 4 according to the preferred embodiment of the invention.

FIG. 8 is a flow diagram illustrating a variation on FIG. 7.

DETAILED DESCRIPTION OF THE INVENTION

Figure 1A:
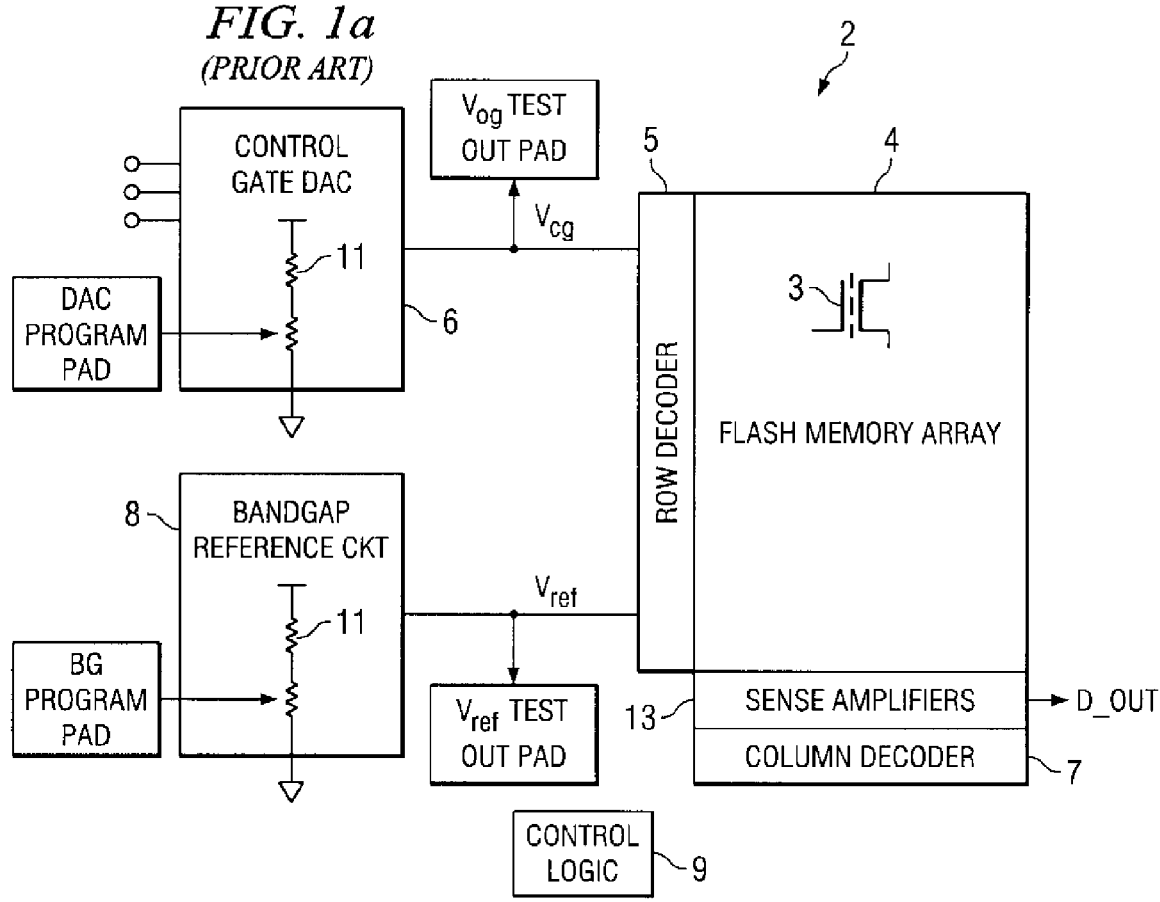
FIG. 1a is an electrical diagram, in block form, of a conventional trimmable flash memory device.

The present invention will be described in connection with its preferred embodiment, namely as implemented into a flash memory device and utilized either or both in wafer or die form, prior to packaging, and after packaging. However, it is contemplated that this invention may also be beneficial in the trimming or adjusting of performance characteristics of programmable memory and logic of other types besides flash memory. Accordingly, it is to be understood that the following description is provided by way of example only, and is not intended to limit the true scope of this invention as claimed.

FIG. 2 illustrates, in a generic fashion, the architecture of flash memory device 20 constructed according to the preferred embodiment of the invention. As mentioned above, it is contemplated that this invention may be utilized in connection with a wide variety of flash memory architectures, and as such the architecture illustrated in FIG. 2 is presented by way of example only. As such, flash memory device 20 includes array 24 of flash memory cells 21 arranged in rows and column, for example organized as a NAND flash memory. In the context of a NAND architecture, control logic 29 receives command inputs from external to flash memory device 20, for example from a memory controller; these commands control the cell locations of array 24 that are to be written to or read, select whether a read operation or a write operation is to be performed, and also control the operating mode of flash memory device 20. In this preferred embodiment of the invention, as will be apparent below, a special test operating mode is available to carry out the measuring and trimming of various analog voltages in flash memory device 20. Control logic 29 is connected to the other functional constituent blocks of flash memory device 20, in the conventional manner (such connections not shown in FIG. 2 for the sake of clarity).

In the conventional manner, specific memory cells 21 in array 24 are accessed by way of row decoder 25 and column decoder 27. Row decoder and multiplexer (mux) 25 controls the voltage levels applied to word lines of the rows of memory cells 21 in array 24 to select one or more rows of array 24, such word lines corresponding to the control gates of memory cells 21 in this arrangement. As evident from FIG. 2, row decoder and mux 25 receives and selects among various analog voltages for use as the control gate voltages, depending on the particular operation to be performed (e.g., in response to a read/write control signal from control logic 29), and also in response to the row portion of an address signal from control logic 29. In this example, read/verify digital-to-analog converter (DAC) 26 generates a read or verify voltage as a control gate voltage for read or verify operations, and programming DAC 32 generates a programming voltage as a control gate voltage for programming operations. Other potential control gate voltages may also be applied to row decoder and mux 25, such voltages including a high read voltage $V_{read}$ which is to be applied to the control gates of unselected transistors in a NAND arrangement, and the like. Other voltages may also be applied to row decoder and mux 25, as known in the art. Row decoder and mux 25 is operable, in the conventional manner, to route the appropriate control gate voltages generated by DACs 26, 32 to the desired word lines, based on the current value of the row address.

Column decoder 27 controls the selection of one or more columns of array 24, typically by coupling the source/drain paths of the transistors of memory, cells 21 to selected bit lines. Sense amplifiers 23 are provided to sense the programmed levels of the selected memory cells 21. As will be described in further detail below, flash memory device 20 according to this embodiment of the invention is a multi-level cell (MLC) flash memory, and as such sense amplifiers 23 include the conventional circuitry for determining the particular level programmed in each of the selected memory cells 21. The output state of the addressed memory cells, in a read operation, is then output by way of data out bus D_OUT as shown in FIG. 2.

FIG. 3 illustrates an example of an arrangement of NAND flash memory cells 21 in a set of columns of array 24. In this example, four memory cells 21(0,0) through 21(3,0) are arranged in column 0, corresponding to bit line $BL_0$, and four memory cells 21(0,k) through 21(3,k) are arranged in column k of array 24. The number of bit lines, k, might typically be several thousand, but could be smaller or larger depending on the specific implementation. As such, the source/drain paths of NAND memory cells 21 are connected in series; one end of this series chain is connected to source line SL via source line select transistor 33B, and the other end to bit line $BL_0$ via drain line select transistor 33T. The gates of bit line select transistors 33B, 33T are controlled by column decoder 27, in the conventional manner. When selected, therefore, the series source/drain paths of memory cells 21 determine the extent of conduction between source line SL and bit line $BL_0$, which is sensed by sense amplifier $23_0$ for this column. It is understood that although FIG. 3 shows one NAND chain connected to each bit line (such as BL0), in actuality many similar chains are also connected to each bit line, and the gates of all transistors in all of these chains are also controlled by row decoder and mux 25.

In NAND flash memory device 20 according to this preferred embodiment of the invention, the programmed state of a particular one of cells 21 in a series chain as shown in FIG. 3 is determined by applying a control gate voltage $V_{cg}$ and a high "on" level to all of the other cells 21 in the chain except the cell 21 to be read, turning on each of these unselected cells regardless of their programmed level. The control gate voltage $V_{cg}$ of the addressed cell is applied at a level that permits detection of whether the corresponding cell 21 is programmed to a particular level. For example, if cell 21(1,0) of FIG. 3 is to be read, the control gate voltages $V_{cg0}$, $V_{cg2}$, $V_{cg3}$ are all driven to a high, "on", level, and the control gate voltage $V_{cg1}$ applied to memory cell 21(1,0) is driven to a more intermediate "verify" level, to determine whether cell 21(1,0) has been programmed to a particular level. If so, and the transistor of cell 21(1,0) is not turned on by the verify level and sense amplifier $23_0$ will sense an open circuit between bit line $BL_0$ and source line SL; if it has not been programmed to this level, the transistor of cell 21(1,0) will turn on, and sense amplifier $23_0$ will sense conduction between bit line $BL_0$ and source line SL.

Figure 1B:
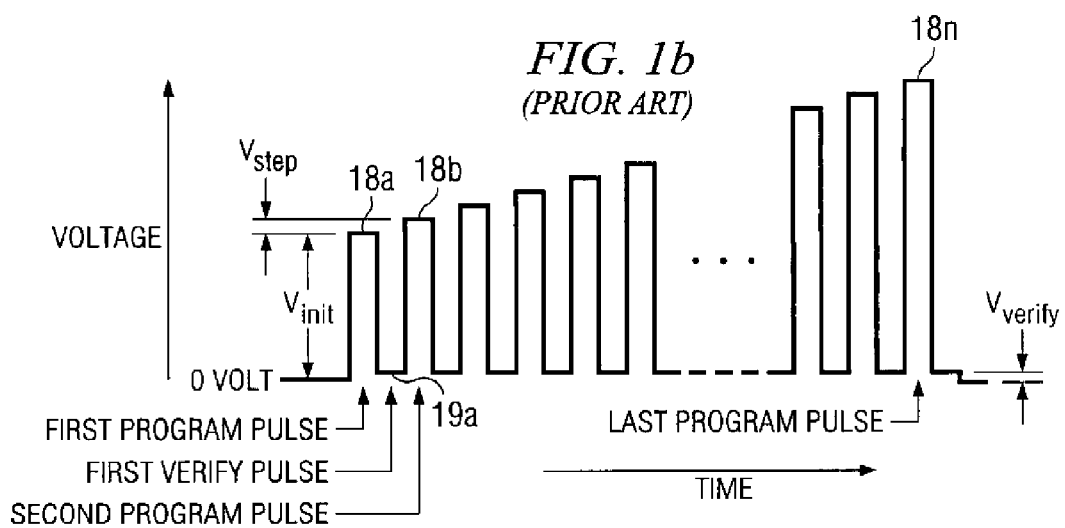
FIG. 1b is a waveform diagram of programming voltage on a selected word line as a function of time.

According to this preferred embodiment of the invention, the high voltages involved in the MLC programming of cells 21 are generated by programming circuitry 32, the detailed construction of which will be described below in connection with another aspect of this invention. Programming circuitry 32, under the control of control logic 29, effects programming of a particular MLC state by generating a selected number of pulses of a relatively high voltage as control gate voltage $V_{cg}$;

row decoder 25 forwards these pulses as signals on the word lines of the selected one or more rows of memory cells 21 in array 24. Typically, as shown in FIG. 1b, the programming voltage begins with a pulse at an initial programming voltage 18a, with subsequent pulses (18b . . . 18n) stepping up in voltage by a fixed step size with each pulse or group of pulses. Typically after each or at least after some programming pulses the state of the programming cells is read back and verified during time period 19a. This may require one or more different values of $V_{cg}$ as described below. When an individual cell reaches its target value, it is "locked out" from further programming even though additional programming pulses are applied to program other cells in the same programming group. This process is described in U.S. Pat. No. 5,172, 338 referenced earlier. According to this embodiment of the invention, the various MLC programming levels are programmed by varying the number and voltage of programming pulses for each of the states.

As described above, sense amplifiers 23 in this preferred embodiment of the invention sense whether a particular addressed cell 21 is conductive when a verify voltage is applied to its control gate as its control gate voltage $V_{cg}$. In this MLC example, one of the particular MLC programmed states is sensed by applying varying control gate voltages $V_{cg}$ to the gate of the selected memory cell 21. The logical data stored in the selected memory cell 21 is then derived from logical combination of the sensed results from these multiple control gate read voltages.

FIG. 4 illustrates an example of MLC programming levels in flash memory device 20 according to the preferred embodiment of the invention, for the example of a flash memory cell capable of storing a two bit value (i.e., having four possible levels). The plot of FIG. 4 effectively corresponds to a probability distribution of the threshold voltage $V_t$ of flash memory cells 21 as erased (curve 40E) and as programmed into three other logic levels (curves 40A, 40B, 40C). In this example, a completely erased cell corresponds to a negative threshold voltage $V_t$, (i.e., an n-channel MOS transistor in depletion mode), such that an erased memory cell 21 will conduct with a gate voltage at zero volts relative to its source voltage. Verification of this erased (logic "11") state can be made by observing that cell 21 conducts with applying control gate voltage $V_{cg\_EV}$ to the control gate of cell 21, and observing that each cell 21 that is intended to be erased continues to conduct at this slightly negative voltage.

Memory cells that are to be programmed to the "C" MLC level have their so-called "upper page" bit of the cell 21 programmed, which corresponds to a binary data value of 01. This state is typically programmed by applying a selected number of rapid programming pulses, for example eighteen pulses of 10 μsec each, as control gate voltage $V_{cg}$ to cell 21. These multiple rapid pulses shift the threshold voltage $V_t$ of cell 21 into the range shown by curve 40C. This programmed level can be verified by applying voltage $V_{cg\_CV}$ (which is at the lowest limit of the threshold voltage distribution curve 40C) to those cells 21 programmed to the "C" level, and ensuring that none conduct.

Memory cells 21 that are to be programmed to the lower "A" MLC level, on the other hand, can be so programmed by the application of fewer, lower voltage, programming pulses to their control gates. For example, twelve programming pulses of 10 μsec each can be used to set the "A" level, effectively programming the "lower page" bit of cell 21 while leaving the "upper page" bit erased, thus storing a binary data value of 10. The programming of the "A" level can be verified by applying voltage $V_{cg\_AV}$ (the lower limit of the threshold voltage distribution for "A" state cells, as shown by curve 40A) as the control gate voltage, and ensuring that none of the "A" level programmed cells conduct.

In this example, the "B" programmed level, which corresponds to both the "upper page" and "lower page" bits being programmed and thus indicating the binary value 00, is evident by the middle level of threshold voltages. The "B" level, in this example, is programmed by again programming a cell 21 that is already programmed to the "A" level. This programs both the "upper" and "lower" page bits for the cell 21. For example, the "B" level may be programmed by applying a second set of twelve programming pulses, beginning at a slightly higher initial programming voltage, each pulse also 10 µsec in duration. As known in the art, due to the physical mechanism of the trapping of charge on the floating gate of cells 21, this repeated programming results in a threshold voltage that is above that achieved with a first set of pulses, but below that attained by the more numerous and higher voltage set of rapid pulses used to program the "C" level. The "B" level cells 21 can be verified as such by applying voltage $V_{cg\_BV}$ to the control gate, and ensuring that none of the "B" level cells conduct.

FIG. 4 also shows the high voltage $V_{read}$, to which the control gates are biased for unselected cells in a read or verify operation. This voltage $V_{read}$ is above the threshold voltage of any of the programmed states, and as such is sufficient to turn on any of memory cells 21.

In operation of flash memory device 20, additional margin is provided in the actual reading of data from the programmed cells, through the use of control gate read voltages that are somewhat below that of the verify voltages, for example by a margin on the order of 0.4 volts or more. The read voltages for reading the "A", "B", and "C" levels (i.e., determining that the cells programmed to those levels do not conduct) in this example are shown as read voltages $V_{cg\_AR}$, $V_{cg\_BR}$, $V_{cg\_CR}$, respectively. In this regard, ground may nominally correspond to read voltage $V_{cg\_AR}$, considering that the erased state "11" corresponds to negative threshold voltages. As known in the art, sensing of the four levels can be effected by applying only two of the possible read voltages $V_{cg\_AR}$, $V_{cg\_BR}$, $V_{cg\_CR}$ in sequence, to determine the one of four data states stored. For example, the read voltage $V_{cg\_BR}$ may be first applied to determine the state of the "upper page" bit, followed by either the read voltages $V_{cg\_AR}$ or $V_{cg\_CR}$ to determine the "lower page" bit state, depending on the result of the upper page sensing. These and other approaches to sensing the state of a MLC cell, as known in the art, are useful in connection with this invention.

In some embodiments all states are programmed during the same programming cycle. That is, the programming waveform of FIG. 1b is applied to the selected word line and individual bits destined for the A state reach that level after a few pulses and are "locked out" during the additional programming pulses and remain in that state. Some number of pulses later, those bits destined for the B state reach it and are locked out for the remainder of the programming pulses, and even later those bits destined for the C state reach their intended level and are locked out. Programming continues until all bits on the word line reach their desired state. This process is often called "full sequence programming." In other embodiments complete programming into the four states consists of two separate steps often called "upper-lower page programming." In the first step when only the "lower page" of data is available, bits which should contain a 0 are programmed into state A and bits which should contain a 1 are left in state E. At a later time when data for the "upper page" becomes available, if the upper page data for a given cell is a 0, it is programmed into either state B or state C depending on the lower page data already stored at that location. Cells in which the lower page was a 1 are programmed from state E to state C; cells in which the lower page was a 0 are programmed from state A to state B. However, the initial programming level for the upper page programming can be chosen to be greater than that used previously for the lower page programming because it is known that more programming energy (voltage level and number of pulses) will be required to move the threshold to a higher level. While the lower page programming might start with 10 volts, the upper page programming would typically start at a higher level, for example 12 volts, though the programming waveform would be similar to FIG. 1b in each case.

Referring back to FIG. 2, according to this preferred embodiment of the invention, one or more analog voltage generator circuits generate the various control gate voltages $V_{cg}$ that are applied to the selected word lines (control gates) of array 24, depending on the level to be read. Preferably, these analog voltage generator circuits are realized in the form of digital-to-analog converters (DACs), so that the analog voltages generated can be controlled by digital control signals. As such, while this specification will refer to DACs as generating these various analog voltages, it is to be understood that other controllable circuits for generating analog voltages may also be used in their stead, without departing from this invention. Either a single read/verify DAC 26 may be provided for generating all of the analog read or verify voltages for the various MLC levels, as shown in FIG. 2 (assuming the DAC to be sufficiently linear over the range of read and verify voltages), or alternatively multiple DACs may be provided, each associated with one of the MLC levels.

According to this preferred embodiment of the invention, read/verify DAC 26 provides the read and verify control gate voltages for each of the "A", "B" and "C" read and verify levels. For the example of the "B" level, DAC 26 generates read voltage $V_{cg\_BR}$, and also verify voltage $V_{cg\_BV}$ at an offset from read voltage $V_{cg\_BR}$. In response to the value of its digital input, however, DAC 26 generates multiple voltage levels that vary slightly (on the order of 0.05 volts) from one another, depending on the resolution with which this "B" level is to be trimmed. DAC 26 would similarly generate a group of read and verify voltages corresponding to read voltage $V_{cg\_CR}$ and verify voltage $V_{cg\_CV}$, for the "C" level, and also for the "A" level. Enabling and control of the desired voltages generated by DAC 26 is effected, in this example, by DAC enable and control circuit 30, under the control of control logic 29. DAC enable and control circuit 30 preferably includes a non-volatile programmable cell to store indications of the selected DAC voltages, or a volatile latch loaded with data from a non-volatile programmable cell located elsewhere.

As shown in FIG. 2, read/verify DAC 26 generates these read and verify voltages based on reference analog voltages. For example, bandgap reference voltage circuit 70 produces a stable and regulated reference voltage $V_{ref}$ that is applied to read/verify DAC 26, based upon which the read and verify voltages are produced. For this example, in which some of the read and verify voltages may exceed the external power supply voltage, read/verify charge pump 72 is provided to generate such higher voltage levels for use by read/verify DAC 26. It is contemplated that those skilled in the art having reference to this specification will be readily able to realize circuits 70, 72, and others as needed, and to apply those voltages to the digital-to-analog conversion effected by read/verify DAC 26. It is of course contemplated that other approaches to the construction and operation of read/verify DAC 26 may alternatively be employed, without departing from the scope of this invention.

Referring back to FIG. 2, flash memory device 20 includes a special external pin or pad WP_, which is an externally accessible terminal that has one function in normal operation, but which is involved in the trimming of an analog voltage in a special test mode, as will be described below. For this trimming functionality, external pin WP_ is connected to an input of row decoder and mux 25, as shown in FIG. 2. In this exemplary embodiment of the invention, a low logic level applied to write protect pin WP_ causes write protect logic 34 to inhibit write operations in normal operation. Of course, other functional external pins, including control and address pins, may alternatively be used for the special test functionality to be described below.

Figure 5:
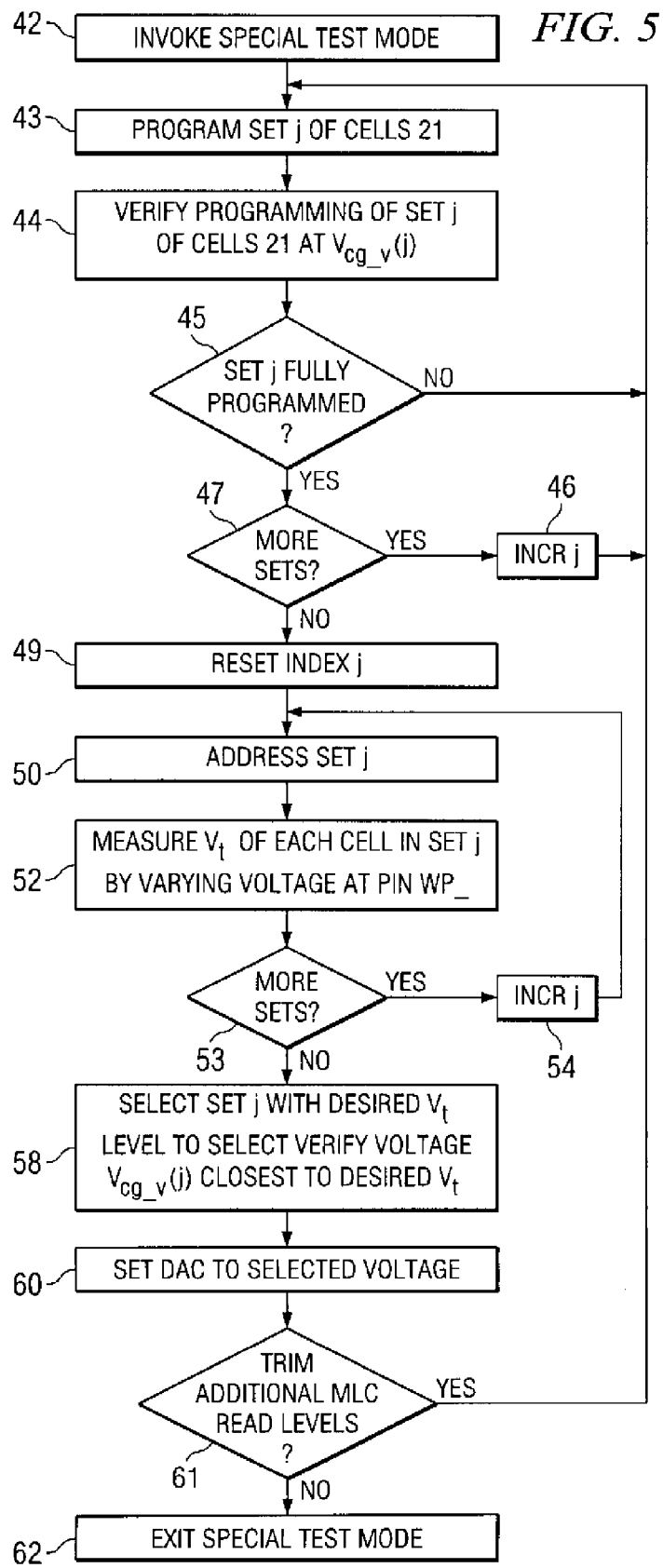
FIG. 5 is a flow diagram illustrating a method of trimming the read/verify circuitry in the flash memory device according to the preferred embodiment of the invention.

Referring now to FIG. 5, the operation of flash memory device 20 in effecting trimming of its read and verify voltages will now be described in detail. As mentioned above, the trimming process of FIG. 5 may be performed during manufacture when flash memory device 20 is still in wafer or die form. Because this trimming process can be performed using functional pins of flash memory device 20 in a special test mode, the trimming process of FIG. 5 may alternatively or additionally be performed after the packaging of flash memory device 20, so that stress-induced variations and other effects of packaging on device performance can be compensated. It is also contemplated that, if desired, the trimming process of FIG. 5 according to the preferred embodiment of the invention can also applied after assembly of flash memory device 20 into its system application. It is contemplated that the measurement and trimming process can be readily performed by conventional automated test equipment, or bench equipment in a characterization mode if desired. It is further contemplated that the commands suitable for providing the capability of the process of FIG. 5 according to this embodiment of the invention can be readily implemented into control logic 29 by those skilled in the art having reference to this specification, and that the available test equipment can be readily programmed to cooperate with flash memory device 20 to perform this process by those skilled in the testing of flash memory devices and having reference to this specification.

According to this preferred embodiment of the invention, the trimming process is based on a measurement of desired threshold voltage for a given MLC programming level. However, the programming characteristics of memory cells 21, as well as those of programming circuitry 32, are typically not known at this stage of manufacture. And also, as shown in FIG. 4, a population of cells programmed to a given level will exhibit a distribution of threshold voltages. However, as well known in the art, the programming of flash memory cells is typically performed as a programming sequence followed immediately with a verify operation (i.e., a read operation with an elevated control gate voltage, to provide a guardband margin). According to this preferred embodiment of the invention, multiple sets of memory cells 21, e.g., each set being a page or block of cells, are defined. Each set of cells 21 is associated with one of multiple verify voltages issued by read/verify DAC 26 for purposes of this trimming process, and as such its cells are programmed to the extent that read/verify DAC 26 can verify that the threshold voltage of its cells are all at or above its associated verify voltage. External measurement of the threshold voltage distributions are performed to select a set of cells 21, and thus its associated read/verify DAC 26, that has the desired threshold voltage distribution relative to an absolute desired voltage.

Referring now to FIG. 5, an example of the trimming method according to the preferred embodiment of the invention will now be described in detail. In process 42, the special test mode is invoked, preferably by applying and executing a command via control logic 29 in the conventional manner for NAND flash memory devices. It is contemplated that one or more particular command codes will be reserved, within control logic 29, for the invoking and exiting of this special test mode. In process 43, each memory cell 21 in a first set j of memory cells 21 (e.g., a block or page of cells 21), is programmed by programming circuitry 32, by the application of one or more programming pulses. In process 44, read/verify DAC 26 performs a verify operation, using a corresponding control gate voltage $V_{cg\_v}(j)$ for the MLC level, to determine whether all of the cells in set j are programmed to have a threshold voltage at or above that verify voltage. As discussed above, a verify operation is effectively a read of a memory cell 21 by applying a control gate voltage $V_{cg}$, and sensing whether the programmed cell turns on, as a transistor. Referring to FIG. 4, for the example of the "B" programming level, the control gate voltage applied in verify step 44, for set j of memory cells 21, will be the jth control gate verify voltage $V_{cg\_BR}(j)$, which is one of the possible verify voltages that may be generated by read/verify DAC 26, in response to a digital value VSEL (FIG. 6a); this control gate verify voltage $V_{cg\_BR}(j)$, and its digital value VSEL(j), is associated with the set j of memory cells 21 that was programmed in process 43. Accordingly, set j of cells 21 is to be programmed to a level to which read/verify DAC 26 determines that all cells 21 in that set j are programmed to a threshold voltage at or above that jth control gate verify voltage $V_{cg\_BR}(j)$ from DAC 26, whatever it may be. Accordingly, after the verify operation of process 44, decision 45 determines whether all of the cells 21 in set j are fully programmed, i.e., to a threshold voltage at or above that of the jth control gate verify voltage $V_{cg\_BR}(j)$. If not (decision 45 is NO), another programming pulse (typically one pulse) is applied to each cell 21 in set j in process 43, and verify process 44 is repeated using read/verify DAC 26 to determine whether the cells 21 are now programmed to a threshold voltage at or above the jth control gate verify voltage $V_{cg\_BR}(j)$. Once all cells 21 in set j are programmed satisfactorily (decision 45 is YES), decision 47 is executed to determine whether additional sets of cells 21 remain to be programmed. If additional sets of cells 21 remain to be programmed (decision 47 is YES), set and voltage index j is incremented in process 46 to select a next set of cells 21 to be associated with a next control gate verify voltage $V_{cg\_BR}(j)$, and processes 43, 44, 45 are repeated for that next set of cells 21 and corresponding voltage. For example, if the next verify voltage is slightly higher than that of the previous set, this next set of cells 21 will be programmed to a threshold voltage distribution that will be slightly higher in voltage than that of the previous set of cells 21. This incrementing and programming of sets of memory cells 21 continues until a preselected number of sets of memory cells 21 is programmed (decision 47 is NO). In process 49, index j is reset to its initial value.

In process 50, a first set j of memory cells 21 is selected for analysis through the operation of control logic 29, preferably in response to a received command via the command inputs. In process 52, the threshold voltage $V_t$ of each memory cell 21 in this selected set j is measured from terminal WP_. According to the preferred embodiment of the invention, process 52 is performed by varying a voltage applied to terminal WP_ to serve as the control gate voltage $V_{cg}$ of a selected memory cell 21, via row decoder and mux 25, and by monitoring the state of the output from the corresponding sense amplifier 23 to determine the level of the forced control gate voltage $V_{cg}$ at which that addressed memory cell 21 turns on, i.e., conducts significant source/drain current. The measured threshold voltage $V_t$ of the addressed memory cell 21 is then preferably stored or otherwise logged by the automated test equipment, and the measurement of process 52 is repeated for another cell in the block, page, or other group of memory cells 21 constituting set j. If additional sets of cells 21 remain to be measured (decision 53 is YES), cell index j is incremented, and processes 50, 52 are repeated for a next set of memory cells 21.

As discussed above, multiple sets of memory cells 21 are programmed and verified via repeated processes 43, 44, to exhibit different threshold voltage distributions, with the expectation that one of these sets of programmed cells 21 will have a threshold distribution in which the lowest threshold voltage in the distribution of measured threshold voltages is near a desired level. For example, the desired minimum threshold voltage for a "B" programming level may be 1.6 volts. Accordingly, after the threshold voltages of memory cells 21 in each of the sets of memory cells have been measured (decision 53 is YES), the automated test equipment then determines which of these measured sets of cells exhibits a threshold voltage distribution closest to that desired for the particular MLC level being programmed, in process 58. In other words, this determination effectively determines which of the verify voltages generated by read DAC 26 is closest to the desired minimum threshold voltage, based on the external measurements via pin WP_. Upon the selection of a set j of memory cells 21 having a distribution at the desired threshold voltage $V_t$, the control gate verify voltage $V_{cg\_BR}(j)$ associated with that set j of memory cells 21 is also selected, effectively trimming the read and verify voltages according to this preferred embodiment of the invention.

Read/verify DAC 26 is then configured or set for use in normal operation, in process 60, for example by programming a non-volatile element in DAC enable and control circuit 30. Such programming of DAC enable and control circuit 30 may be performed by control logic 29 and programming circuitry 32. Alternatively, a control register or other store within control logic 29 may be programmed with the DAC selection of process 60, and this digital value then forwarded to read/verify DAC 26 on lines VSEL Further in the alternative, a programmable cell within DAC 26 itself may be programmed (or left unprogrammed) in order to set the desired digital value VSEL.

It is contemplated that, in many situations, the selection of the verify voltage for one programming level will also select the proper read and verify voltages for each of the other programming levels in MLC flash memory device 20. In these situations, read/verify DAC 26 would generate both the read control voltage $V_{cg\_Ri}$ and the verify control voltage $V_{cg\_Vi}$ for each of the programming levels (i.e., "A", "B", "C"), with the verify voltage being offset, for a given level, from its read level in order to provide the desired guardband between read and verify. For example, the verify level control voltage $V_{cg\_Vi}$ for a given level i may be on the order of 0.4 to 0.5 volts higher than its corresponding read control voltage $V_{cg\_Ri}$. In this case, single DAC 26 may receive a digital input (e.g., a digital value on lines VMIN to set the minimum output voltage) corresponding to the desired level to be read or verified, perhaps with an additional bit of the digital signal (on lines VMIN) indicating whether the operation is a read or a verify operation. Alternatively, as mentioned above, different MLC programming levels may be supported by different read DACs. As such, if additional MLC levels remain to be trimmed (decision 61 is YES), control returns to process 44 for the next level to be trimmed, and the process repeats. Upon all levels having been trimmed (decision 61 is NO), the special test mode is exited in process 62, for example by applying and executing an exit command via control logic 29. Flash memory device 20 is preferably then in its normal operating mode, in which terminal WP_ again has its normal function (enabling write protection, in this example).

According to this embodiment of the invention, therefore, the read and verify levels of flash memory cells 21, particularly in the MLC context, are measured and adjusted for optimum performance. It is contemplated that this trimming is especially beneficial in MLC flash memories, in which the margins between adjacent programmed states can be quite small. In addition, according to this preferred embodiment of the invention, the measurement and trimming can be accomplished in a special test mode, using terminals that are available externally to the flash memory device and that have a separate function in normal operation. Not only does this capability reduce the chip area required for special trimming pads, and for the conductors and ESD protection structures associated therewith, but this capability also permits post-packaging measurement and trimming of these read levels.

The external measurement and trimming method of this invention may also be applied to programming DAC 32, as will now be described in connection with another aspect of the preferred embodiment of the invention. It is contemplated that the trimming of programming circuitry 32 and the trimming of read/verify DAC 26, may be performed independently from one another, and as such the order in which the programming and read/verify trimming is performed in a manufacturing flow is not believed to be important. This independence is apparent from the process of FIG. 5 described above, considering that the actual threshold voltage $V_t$ of memory cells 21 is externally measured and used in the DAC selection. As such, flash memory devices constructed according to the invention may implement only one or the other of the read/verify and programming trimming functions, if desired and depending on the stability and robustness of the device itself. Of course, it is contemplated that the performing of both read/verify and programming trimming would best optimize device performance.

Referring now to FIG. 6a, the construction of programming DAC 32 according to the preferred embodiment of the invention will now be described. In this example, bandgap reference voltage circuit 70 generates a stable bandgap reference voltage $V_{ref}$. Bandgap reference voltage circuit 70 may be constructed according to conventional circuit designs for bandgap reference circuits, as well known in the art. As such, bandgap reference voltage circuit 70 is preferably constructed to provide a stable bandgap reference voltage $V_{ref}$, over a wide range of voltage and temperature conditions. However, it has been observed, in connection with the invention, that even a stable bandgap reference may not be sufficiently precise to define the programming levels for a modern MLC flash memory. Programming charge pump 76 also applies a high voltage $V_{pp}$, that is used in generating an elevated programming voltage above that of the external power supply voltage, as known in the art.

In this regard, MLC flash memories, as mentioned above, define the multiple programming levels in their memory cells by applying different programming sequences (i.e., duration of programming pulses, number of programming pulses, and voltage amplitude of the programming pulses) to define the multiple levels. As known in the art, variations in the reference voltage that defines the energy of each programming pulse of a nominal voltage or level will result in variations in the programming of the multiple cells. For example, if the reference voltage, upon which the programming pulses are based, is higher than its nominal design value, the "higher"

programming levels (i.e., levels "B" and "C" in flash memory device 20 as described above) will tend to be overprogrammed, reaching the higher levels too rapidly. In this situation, the ability to closely control the programming level is detrimentally affected. On the other hand, if the reference voltage is too low, these higher levels may tend to be underprogrammed with the nominal number of pulses etc. While close control may be available in such a circumstance, the time required to program the higher programming levels is substantially increased, degrading the read/write performance of the device.

According to the preferred embodiment of the invention, therefore, programming DAC 32 includes the ability to trim its programming voltages, permitting the manufacturer or user to optimize the control of higher level MLC programming without lengthening the programming time. As shown in FIG. 6a, programming DAC 32 is constructed to include a digital-to-analog converter (DAC) circuit 34, which receives the digital input on lines VSEL at an input, and which generates analog voltage $V_{ana\_out}$ in response to that digital input, and in response to a reference voltage $V_{ref}$ and charge pump programming voltage $V_{pp}$. Also as shown in FIG. 6a, programming DAC 32 may optionally include additional control functions, for example step select 35 and minimum voltage select 36. Step select 35 receives a digital input on one or more lines STEP, in response to which step select 35 determines the voltage difference (e.g., from 0.15 volts to 0.30 volts) in the analog output voltage $V_{ana\_out}$ between adjacent digital input values on lines VSEL (see also Vstep 17 in FIG. 1b). Minimum voltage select 36 receives a digital input on one or more lines VMIN, and determines the minimum voltage of analog output voltage $V_{ana\_out}$ (e.g., for a zero value on lines VSEL), corresponding to the starting programming voltage (see also Vinit 18a in FIG. 1b).

According to this embodiment of the invention, DAC circuit 34 need not be a high-speed digital-to-analog converter, as the digital value on lines VSEL are not contemplated to change rapidly during normal operation, and the digital values on lines STEP and VMIN will typically not change once a programming cycle has started. As such, DAC circuit 34 may be arranged in the form of a voltage divider, in which digitally controlled variable resistors are arranged to set the output voltage, for example by selectively turning on and off transistors, thus include and shorting out selected resistors, in a parallel resistor network, based on the state of the digital inputs. A simplified equivalent circuit for programming DAC 32 is illustrated in FIG. 6b, in the form of a voltage divider. An upper resistor RL, for example having a fixed value, is connected between programming charge pump voltage $V_{pp}$ and reference node $V_R$, which is applied to amplifier 38 as will be described below. Variable resistor RB forms one parallel leg between reference node $V_R$ and ground, and presents a resistance responsive to the value of digital signal VMIN. In another parallel leg, variable resistors R, RD are in series with one another. Resistor R presents a resistance that is controlled by the digital signal on lines VSEL, while resistor RD presents a resistance that is controlled by the digital signal on lines STEP.

In this example amplifier 38 controls the voltage on node $V_R$ to be equal to $V_{ref}$ by turning on or off the charge pump 76 and increasing or decreasing the value of $V_{PP}$ such that it will supply only the required current to maintain $V_R$ at a constant value. Therefore, the resistance of variable resistor RB determines the minimum voltage at the output node $V_{PP}$ (i.e., when resistor R is at its maximum value). The resistance of series variable resistor RD determines the size of the change in resistance in its parallel leg between adjacent values (i.e., the smallest resistance change) in variable resistor R, corresponding to adjacent values of the digital signal on lines VSEL. As such, for given step size and minimum voltage levels defined by the digital signals on lines STEP, VMIN, respectively, the voltage at the output node $V_{PP}$ will be determined by the value of the digital signal on lines VSEL.

According to this preferred embodiment of the invention, trimming of programming DAC 32 involves the selection and enabling of the output level that provides the desired programming performance. The process of performing this trimming, according to this preferred embodiment of the invention, will now be described in detail relative to FIG. 7. It is contemplated that those skilled in the art having reference to this specification can readily implement the necessary capability for performing the process of FIG. 7 in control logic 29 of flash memory device 20, and can readily program automated test equipment accordingly. And, as in the case of the read/verify voltage trimming, it is contemplated that the programming trimming process of FIG. 7 can be performed in the manufacturing flow when flash memory device 20 in wafer or die form, or after packaging, or both.

Trimming of the initial programming voltage in flash memory device 20 according to this preferred embodiment of the invention begins with process 78, in which the special test mode is invoked. As in the trimming of the read and verify voltages, it is contemplated that process 78 is preferably performed by applying a special command to control logic 29, as typical for NAND flash memories such as memory device 20, such command executed by control logic 29 to enter the special test mode.

The process then begins in process 80 with the selection of a first programming DAC output voltage m to be generated by programming DAC 32. In process 82, a selected number of programming pulses are applied to a selected memory cell 21n (or set of cells 21n as described below), using the mth programming DAC output voltage from programming DAC 32, upon which the initial (and consequently successive) programming voltages are based. Here m and n are in a defined relationship with each other; the first DAC voltage (m=1) is written into a specific cell 21 (n=1). For example, a nominal number of programming pulses (e.g., twelve) of nominal duration (e.g., 10 μsec) may be applied as the control gate voltage $V_{cg}$ to the selected cell 21n. If additional programming voltages m remain to be used in programming cells 21n (decision 83 is NO), offset voltage index m and cell index n are each incremented in process 84, and select and programming processes 80, 82 are repeated for this next programming voltage and its associated memory cell. The cell(s) 21n associated with any one programming voltage m and cell index n are typically included as part of one or more word lines Vcgi in FIG. 3, and the set of cells might be one or more of cells 21(i,0) through 21(i,k).

Once all of the potential offset voltages have been used to program one or more associated memory cells 21n (decision 83 is YES), the threshold voltage $V_t$ is measured for each of the programmed cells 21, in process 85. As in the process of trimming read/verify voltages described above, the measurement of the threshold voltage $V_t$ of each of cells 21 is performed in this special test mode by applying a varying voltage to terminal WP_, which is forwarded via row decoder and mux 25 as the control gate voltage $V_{cg}$ to an addressed memory cell 21n. The state of the output from the corresponding sense amplifier 23 is monitored, while the applied voltage is being varied, for example in a step-wise manner, to determine the level of the forced control gate voltage $V_{cg}$ at which addressed memory cell 21n conducts significant source/drain current. This measured threshold voltage $V_t$ for the addressed memory cell 21n is then stored or otherwise logged, for example by the automated test equipment. This measurement process 52 is repeated for each of the memory cells 21 that was programmed by an instance of process 82.

In process 86, the results of process 85 are analyzed, for example by the automated test equipment, to determine the one of all of the memory cells 21n that has a threshold voltage closest to the desired level. For example, the desired threshold voltage $V_t$ for a "B" programming level in an MLC flash memory may be 1.60 volts, in which case process 86 determines the one of programmed memory cells 21 that has a measured threshold voltage $V_t$ closest to that voltage, having been programmed with the nominal number of programming pulses at nominal duration. Once this cell 21n is identified in process 86, its corresponding programming voltage m is then set in process 88, for example by programming a non-volatile cell or device in control logic 29, setting a non-volatile control bit in a control register or other configuration store, either of which will then be communicated to programming DAC 32 by lines VSEL, or by programming a device within programming DAC 32 itself to set the desired programming voltage in normal operation. The special test mode is then exited in process 90, preferably by applying an exit command to the command inputs of control logic 29. Flash memory device 20 is preferably then in its normal operating mode, in which terminal WP_ again has its normal function (enabling write protection, in this example).

As mentioned above, each programming voltage m may be applied in the programming of a set of memory cells 21, such as a page (21(i,0) to 21(i,k) of FIG. 3 or block (all of the pages within the NAND string, i=0 to 3 of FIG. 3) of memory cells. In this case, the threshold voltage distribution of programmed memory cells 21 in each set is measured in process 85. It is contemplated that the programming of a set of cells 21 for each programming voltage will provide improved accuracy in the selection of the optimum offset voltage according to this preferred embodiment of the invention, considering that there is a distribution of the programming characteristics among the cells on the same flash memory device 20.

Included within the scope of the invention is the ability to re-use the memory cell or set of cells 21 for different measurements. For example, FIG. 8 (with reference numbers marked with prime corresponding to the equivalent number in FIG. 7) shows a slight variation on FIG. 7 in which step 85' precedes the loop decision step 83' and is changed slightly to not only include the measurement of the selected cell 21n but also storing the DAC value m and threshold into a table, followed by erasing cell 21n and using this same cell (or set of cells) when incrementing the voltage index m (step 84') for the next DAC value. In this embodiment the decision criteria in step 83' can include the ability to continue the iterations or not based on the results of step 85', rather than simply repeating for a predetermine number of m iterations as in FIG. 7. Step 86' then consists of selecting the desired threshold voltage of cell n (or threshold distribution from set n) from the table and step 87' uses DAC voltage m from the table associated with cell n. This same principle call also be applied to the algorithm disclosed in FIG. 5.

It is contemplated that selection of the appropriate offset voltage will be effective to provide linear programming performance for all of the MLC programming levels to be programmed into cells 21 of flash memory device 20. Alternatively, in more complex devices, it is contemplated that multiple programming DACs may be provided, each associated with one or more of the available MLC programming levels, in which case the process of FIG. 7 would be repeated for each such level and its corresponding programming DAC.

In such a case, for example if another programming DAC is provided for "upper page" programming (i.e., level "C" programming) by applying a higher number of pulses (e.g., eighteen), the process of FIG. 7 would, be repeated to select the corresponding offset voltage for this additional level.

Figure 9:
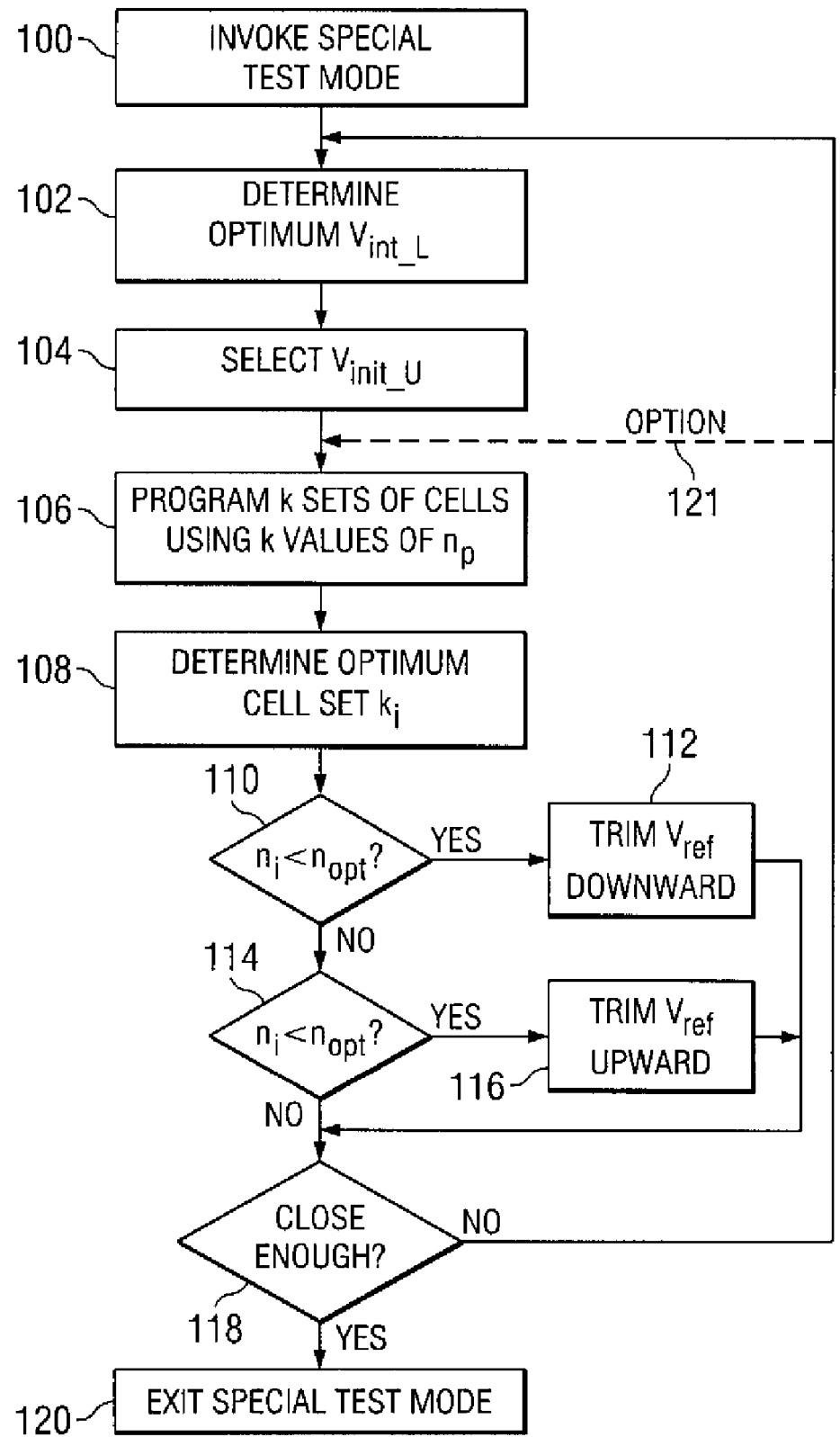
FIG. 9 is a flow diagram illustrating how a reference voltage can be trimmed when using multiple starting voltages for programming a set of cells.

In another embodiment, it may be desirable to trim the bandgap reference voltage $V_{ref}$, so that when using upper-lower page programming the higher initial voltage used during the upper page programming tracks correctly with that obtained using the above method for the lower page programming, allowing both programming cycles to use the same DAC. $V_{ref}$ affects both initial programming voltage for each page as well as the step size, so an iterative method can be used to trim $V_{ref}$ as shown in FIG. 9. First, in step 100 special test mode is invoked and an optimum value of $V_{int\_L}$, the initial programming voltage used to program the lower page to state A, is calculated using, for example, the method of FIG. 7 in step 102. In step 104 the initial programming voltage for the upper page is assumed using a pre-characterized value for DAC code (input to lines $V_{MIN}$ in FIG. 6b). The selected sets of cells are then programmed in step 106 using different numbers of programming pulses. For example, one set is programmed with 9 pulses, another set with 10 pulses, etc. In step 108 the sets are examined to determine which set has the optimum distribution (for example, most nearly matches the desired state C distribution). If the number of pulses $n_t$ used in this set is less than desired, $V_{ref}$ is too high and is trimmed downward in step 112. Conversely, if the number of pulses is too large $V_{ref}$ is trimmed upward in step 116. Finally, in step 118 a decision is made to continue iterating this process, or if the desired distribution is close enough (for example, the number of pulses used in the distribution that most closely matches state C is equal to the desired number, $n_{opt}$) then special test mode is exited in step 120. It may be sufficient to only iterate on the upper page programming, following option path 121.

A slight variation of this method is to set k=1, use the previously trimmed read DAC (see FIG. 5) to determine the verify C level in step 106, and step 108 consists of counting the number of pulses need to reach this level, followed by adjusting $V_{ref}$ in steps 110-116. It may be sufficient to only iterate on the upper page programming, following option path 121.

It is further contemplated that additional programming DACs provided within flash memory device 20, may be trimmed in this manner to determine other analog voltages within flash memory device 20, either based on the output of bandgap reference voltage circuit 70 or another bandgap reference circuit, as desired. For example, it is contemplated that voltage $V_{read}$ (FIG. 4) to which the control gates of unselected memory cells 21 in a NAND chain are biased in the read of a selected cell (see FIG. 3), may also be based on bandgap reference voltage circuit 70 or another instance of the same, as may other regulated and unregulated analog voltages within flash memory device 20. Similarly, it is contemplated that this trimming method may also be applied, if desired, to configure an offset DAC in the generation of erase voltages to be applied to the control gates of memory cells 21 in the erasing of a block of array 24.

According to this invention, therefore, various analog voltages within a flash memory device 20 can be readily adjusted and trimmed to optimize programming and read performance, as well as other performance parameters. This trimming can be accomplished either or both in wafer or die form, or after packaging, because of the ability to use external terminals, in a special test mode, that also provide functionality during normal operation. In addition, substantial chip area is saved by the dual use of these external terminals, while full ESD protection is also afforded such pins.

While the present invention has been described according to its preferred embodiments, it is of course contemplated that modifications of, and alternatives to, these embodiments, such modifications and alternatives obtaining the advantages and benefits of this invention, will be apparent to those of ordinary skill in the art having reference to this specification and its drawings. It is contemplated that such modifications and alternatives are within the scope of this invention as subsequently claimed herein.

What is claimed is:

1. A method of trimming an analog voltage in a flash memory device, comprising the steps of:
   issuing a first command to place the flash memory device into a test mode, a terminal of the flash memory device has a test function when in the test mode;
   measuring a threshold voltage of at least one non-volatile memory cell by applying a control gate voltage at the terminal of the flash memory device while in the test mode;
   operating an analog voltage generator circuit at a plurality of output analog voltage levels to access the at least one memory cell while in the test mode;
   responsive to the measuring and operating steps, setting the output analog voltage level of the analog voltage generator circuit for use in normal operation of the flash memory device; and
   issuing a second command to place the flash memory device into a normal operating mode after the setting the output analog voltage level of the analog voltage generator circuit for use in normal operation;
   wherein the terminal has an operating function in the normal operating mode.

2. A method of trimming an analog voltage in a flash memory device, comprising the steps of:
   measuring a threshold voltage of at least one non-volatile memory cell by applying a control gate voltage at a terminal of the flash memory device;
   operating an analog voltage generator circuit at a plurality of output analog voltage levels to access the at least one memory cell;
   responsive to the measuring and operating steps, setting the output analog voltage level of the analog voltage generator circuit for use in normal operation of the flash memory device; and
   programming memory cells in each of a plurality of sets of memory cells;
   wherein the measuring step comprises
   measuring a threshold voltage of each memory cell of the plurality of sets of memory cells to identify one of the sets of memory cells as having a threshold voltage distribution at or near a first desired threshold voltage.

3. The method of claim 2, wherein the operating step comprises, for each of the plurality of sets of memory cells:
   operating the analog voltage generator circuit at an associated analog output voltage level for the set of memory cells, to apply a control gate voltage to each of the memory cells in the set of memory cells, in a read operation;
   sensing the state of the memory cells in the set of memory cells in response to the operating of the analog voltage generator circuit at its associated analog output voltage level; and
   responsive to the sensing step, determining that one or more memory cells in the set of memory cells has a threshold voltage below the control gate voltage, repeating the programming and operating step for that set of memory cells;
   and wherein the setting step comprises:
   responsive to the measuring step, setting the analog output voltage level of the analog voltage generator circuit to a voltage corresponding to the analog output voltage level associated with the identified set of memory cells.

4. The method of claim 3, wherein the first desired threshold voltage corresponds to a first multi-level cell programming level;
   and further comprising:
   for each of a plurality of sets of memory cells, repeating the programming and operating steps by:
   programming memory cells in the set of memory cells toward a second multi-level cell programming level;
   operating an analog voltage generator circuit at an associated analog output voltage level for the set of memory cells, to apply a control gate voltage to each of the memory cells in the set of memory cells, in a read operation;
   sensing the state of the memory cells in the set of memory cells in response to the operating of the analog voltage generator circuit at its associated analog output voltage level; and
   responsive to the sensing step determining that one or more memory cells in the set of memory cells has a threshold voltage below the control gate voltage, repeating the programming and operating step for that set of memory cells;
   measuring a threshold voltage of each memory cell of the plurality of sets of memory cells to identify one of the sets of memory cells as having a threshold voltage distribution at or near a second desired threshold voltage corresponding to a second multi-level cell programming level; and
   responsive to the measuring step, setting the analog output voltage level of the analog voltage generator circuit to a voltage corresponding to the analog output voltage level associated with the set of memory cells identified as having a threshold voltage distribution at or near the second desired threshold voltage.

5. The method of claim 4, wherein the same analog voltage generator circuit is used in the operating and setting steps for the first and second multi-level programming levels.

6. The method of claim 4, wherein a first analog voltage generator circuit is used in the operating and setting steps for the first multi-level programming level, and wherein a second analog voltage generator circuit is used in the operating and setting steps for the second multi-level programming level.

7. A method of trimming analog voltage in a flash memory device, comprising the steps of:
   measuring a threshold voltage of at least one non-volatile memory cell by applying a control gate voltage at a terminal of the flash memory device;
   operating an analog voltage generator circuit at a plurality of output analog voltage levels to access the at least one memory cell; and
   responsive to the measuring and operating steps, setting the output analog voltage level of the analog voltage generator circuit for use in normal operation of the flash memory device;
   wherein the analog voltage generator circuit generates a programming voltage;
   wherein the operating step comprises:
   programming at least a first memory cell, using the analog voltage generator circuit at a first analog output voltage;

programming at least a second memory cell, using the analog voltage generator circuit at a second analog output voltage;

and wherein the measuring step comprises:

measuring a threshold voltage of each of the programmed memory cells to identify one of the programmed memory cells as having a threshold voltage at or near a first desired threshold voltage;

and wherein the setting step comprises:

setting the analog voltage generator circuit to output an analog output voltage corresponding to that used to program the identified memory cell.

8. The method of claim 7, wherein the repeated programming step comprises:

applying a selected number of pulses of increasing programming voltage from an initial programming voltage to the control gate of a corresponding one of the plurality of memory cells.

9. The method of claim 7, wherein the first desired threshold voltage corresponds to a first multi-level cell programming level;

and further comprising:

programming at least a third memory cell, using the analog voltage generator circuit at a third analog output voltage;

programming at least a fourth memory cell, using the analog voltage generator circuit at a fourth analog output voltage;

measuring a threshold voltage of each of the plurality of programmed memory cells to identify one of the memory cells as having a threshold voltage at or near a second desired threshold voltage corresponding to a second multi-level cell programming level; and setting the analog voltage generator circuit to output an analog output voltage corresponding to that used to program the memory cell identified as having a threshold voltage at or near the second desired threshold voltage.

10. The method of claim 9, wherein the programming steps each comprise the steps of:

applying a selected number of pulses of increasing programming voltage from an initial programming voltage to the control gate of a corresponding one of the plurality of memory cells.

11. The method of claim 7, wherein each of the programming steps comprises programming a set of memory cells using the analog voltage generator circuit at a corresponding analog output voltage;

wherein the measuring step comprises:

measuring a threshold voltage distribution of the sets of programmed memory cells to identify one of the sets of memory cells as having a threshold voltage distribution at, or near the first desired threshold voltage;

and wherein the setting step comprises:

setting the analog voltage generator circuit to output an analog output voltage corresponding to that used to program the identified set of memory cells.

* * * * *